United States Patent
Moore et al.

(10) Patent No.: US 9,252,748 B2
(45) Date of Patent: *Feb. 2, 2016

(54) PASSIVE CAPTURE ADAPTER CIRCUIT FOR SENSING SIGNALS OF A HIGH-SPEED CIRCUIT

(71) Applicant: MCCI Corporation, Ithaca, NY (US)

(72) Inventors: Terrill M. Moore, Trumansburg, NY (US); Roy F. Flacco, Richford, NY (US)

(73) Assignee: MCCI Corporation, Ithaca, NY (US)

( * ) Notice: Subject to any disclaimer, the term of this patent is extended or adjusted under 35 U.S.C. 154(b) by 18 days.

This patent is subject to a terminal disclaimer.

(21) Appl. No.: 14/090,986

(22) Filed: Nov. 26, 2013

(65) Prior Publication Data

US 2014/0084963 A1 Mar. 27, 2014

Related U.S. Application Data

(63) Continuation of application No. 13/559,964, filed on Jul. 27, 2012, now Pat. No. 8,643,405.

(60) Provisional application No. 61/565,115, filed on Nov. 30, 2011.

(51) Int. Cl.
*H03K 3/01* (2006.01)
*H03K 5/01* (2006.01)
*G01R 1/067* (2006.01)
*G01R 29/02* (2006.01)

(52) U.S. Cl.
CPC .............. *H03K 3/01* (2013.01); *G01R 1/06772* (2013.01); *H03K 5/01* (2013.01); *G01R 1/06766* (2013.01); *G01R 29/02* (2013.01)

(58) Field of Classification Search
CPC ........... G01R 1/06766; G01R 1/06772; G01R 29/02; H03K 3/01; H03K 5/01

USPC ................................................ 327/50, 52, 65
See application file for complete search history.

(56) References Cited

U.S. PATENT DOCUMENTS

| 4,074,190 | A | 2/1978 | Bunting |
| 5,554,951 | A | 9/1996 | Gough |
| 6,507,225 | B2 | 1/2003 | Martin et al. |
| 6,847,199 | B2 | 1/2005 | Kaufman et al. |
| 6,865,504 | B2 | 3/2005 | Larson et al. |
| 8,085,067 | B1 | 12/2011 | Stiff |
| 2007/0300005 | A1 | 12/2007 | Shepard et al. |
| 2008/0218258 | A1* | 9/2008 | Crawley et al. .................. 330/10 |

* cited by examiner

FOREIGN PATENT DOCUMENTS

WO  WO 2009/065861  5/2009

*Primary Examiner* — John Poos
(74) *Attorney, Agent, or Firm* — Cesari and McKenna, LLP

(57) ABSTRACT

A multi-stage passive capture adapter (PCA) circuit is configured to sense and recover digital signals present on a high-speed serial bus for capture and analysis in external test equipment. A first stage of the PCA circuit includes a differentiator that functions as a high impedance probe that contacts the serial bus to capture an original input signal waveform of the high-speed digital signals. The signal waveform is fed to a dual-slope comparator/driver that includes a plurality of high-speed comparators and drivers. The second stage includes a differential receiver/shaper that converts logic levels of differential receiver outputs to input signals that set and reset a signal restorer whose output signals are fed to a driver of a driver/shaper. The output of the driver is then fed to a shaper network configured to substantially match an output signal of driver/shaper to the input signal waveform sensed from the high-speed serial bus.

19 Claims, 2 Drawing Sheets

PASSIVE CAPTURE ADAPTER CIRCUIT FOR SENSING SIGNALS OF A HIGH-SPEED CIRCUIT

The present utility patent application is a continuation of U.S. Ser. No. 13/559,964, filed by Terrill M. Moore et al. on Jul. 27, 2012, which claims priority from a provisional patent application of common title, inventorship, and ownership, which is a provisional application assigned Ser. No. 61/565,115 filed on Nov. 30, 2011 and is hereby incorporated herein by reference.

BACKGROUND

1. Technical Field

The present disclosure relates to sensing and reconstructing digital signals of a high-speed circuit for capture and analysis in external test equipment.

2. Background Information

Conventional oscilloscope probes ("scope probes") are generally difficult to use for sensing electrical characteristics of digital signals of a high-speed circuit, such as a high-speed serial bus connecting a plurality of integrated circuits (ICs) on a printed circuit board. Although they may be available in a variety of different impedances, these scope probes generally load the high-speed circuit to which they interface in different ways and to differing amounts. That is, even probes that delicately disturb a signal may distort the waveform. Because of such disruptive loading, it is thus generally difficult to sense and analyze the high-speed digital signals using the conventional scope probes.

In addition certain factors, such as length of a circuit board trace, whether the trace crosses a boundary in a ground plane of the circuit board and/or whether there are other traces nearby, can affect the operation of the high-speed circuit to its detriment, resulting in cross talk, impedance changes, and/or reflections. It is therefore desirable to test for such factors using a commercial version of the high-speed circuit so as to enable any needed debugging. This is particularly true for high-speed serial bus circuitry because its signal paths are treated as transmission lines. However, the serial bus circuitry is often a fine pitch implementation between the ICs and, as such, there is very limited distance on the serial bus for an operator, such as an engineer, to work. Accordingly, there is typically no provision within the implementation for sensing the high-speed digital signals for testing and debugging by external test equipment in normal operation.

SUMMARY

A multi-stage passive capture adapter (PCA) circuit is configured to sense and recover high-speed digital signals present on a high-speed circuit for capture and analysis in external test equipment. Illustratively, the high-speed circuit is a high-speed serial bus coupled between a plurality of integrated circuits on a printed circuit board. According to one or more embodiments described herein, a first stage of the PCA circuit includes a differentiator having a small capacitor coupled to a plurality of resistors to form a high-pass filter with a substantially fast time constant. The differentiator illustratively functions as a high impedance probe that contacts the serial bus to capture an original input signal waveform of the high-speed digital signals. Since the time constant is substantially fast, the differentiator senses only edges of the original input signal waveform.

Upon traversing the differentiator, the signal waveform is fed to a dual-slope comparator/driver of the first stage that illustratively includes a plurality of high-speed comparators and drivers. The outputs of the comparators are illustratively differential signal pairs that are transmitted/driven by drivers over a dual-pair interconnect cable to a second stage of the PCA circuit that is remote from the serial bus to which the high impedance probe of the first stage is connected. Illustratively, the outputs from the dual-slope comparator/driver are arranged as low voltage differential (LVD) signal pairs that are driven over the cable.

According to one or more embodiments, the second stage includes a differential receiver/shaper having a plurality of differential receivers connected to first and second shaper networks, each of which is formed of a resistor and a capacitor arranged in parallel and coupled to a totem pole of resistors. The differential receiver/shaper functions to convert the LVD signal pairs to single-ended signals. The differential receivers are illustratively paired and receive the differential signal pairs transmitted over the cable from the dual-slope comparator/driver. The resulting outputs of the differential receivers are fed to the first and second shaper networks, which illustratively convert the logic levels of the differential receiver outputs to input signals that set and reset a signal restorer of the second stage.

In an embodiment described herein, the signal restorer is an edge reconstruction flip-flop configured to respond to the input signals to reconstruct the edges of the original input signal waveform and deliver output signals that are then fed as input signals to a driver/shaper. The input signals are combined at the driver/shaper to produce a digital signal substantially similar to the input signal waveform. Specifically, a driver of the driver/shaper combines the input signals to an output that is fed to a third shaper network, which illustratively includes a plurality of resistors and a capacitor configured to substantially match an output signal of driver/shaper to the input signal waveform sensed from the high-speed serial bus. In other words, the third shaper network essentially adjusts the loading parameters and transmission characteristics of the second stage of the PCA circuit to match and reconstruct such parameters and characteristics of the probed serial bus.

Advantageously, the PCA circuit provides a high-impedance, front-end interface circuit that senses and recovers digital signal levels equivalent to those present on the high-speed circuit. To that end, the PCA circuit provides a substantially high impedance interface to the high-speed circuit through alternating current (AC) coupling by way of the small capacitor of the differentiator. The differentiator also provides reasonably high impedance at high frequencies, thereby presenting a negligible AC load on the high-speed circuit. In addition, the edge detection and subsequent signal restoration circuitry of the PCA circuit allow input signals to vary considerably in amplitude and wave shape, without materially affecting the relative timing of the signals. Moreover, the use of LVD signaling between the first stage and the second stage of the PCA circuit permits a high degree of convenience for an operator (e.g., an engineer) to work on the circuit because, e.g., external test equipment may be placed at some distance from the signal being probed.

BRIEF DESCRIPTION OF THE DRAWINGS

The above and further advantages of the embodiments herein may be better understood by referring to the following description in conjunction with the accompanying drawings in which like reference numerals indicate identically or functionally similar elements, of which.

DETAILED DESCRIPTION OF ILLUSTRATIVE EMBODIMENTS

The passive capture adapter (PCA) circuit described herein is configured to sense and recover digital signals present on a high-speed circuit which, in one or more embodiments, is a high-speed serial bus connecting a plurality of integrated circuits (ICs) on a printed circuit board. These signals are illustratively sensed and recovered for capture and analysis in test equipment external to the PCA circuit. In particular, the PCA circuit may be configured to sense two types of digital signals on the high-speed serial bus, i.e., a data signal (on a data line) and a strobe signal (on a strobe line). These signals have a simple relationship in that transitions or edges of the strobe signal indicate when to sample the data signal to read the states of the data (e.g., logic levels 1 and 0). In an embodiment, the PCA circuit has two signal channels that are substantially identical, each of which may receive an input signal (i.e., the data signal or the strobe signal) waveform from the serial bus. For ease of depiction and explanation, only one channel of the PCA circuit will be described herein.

Figure 1:
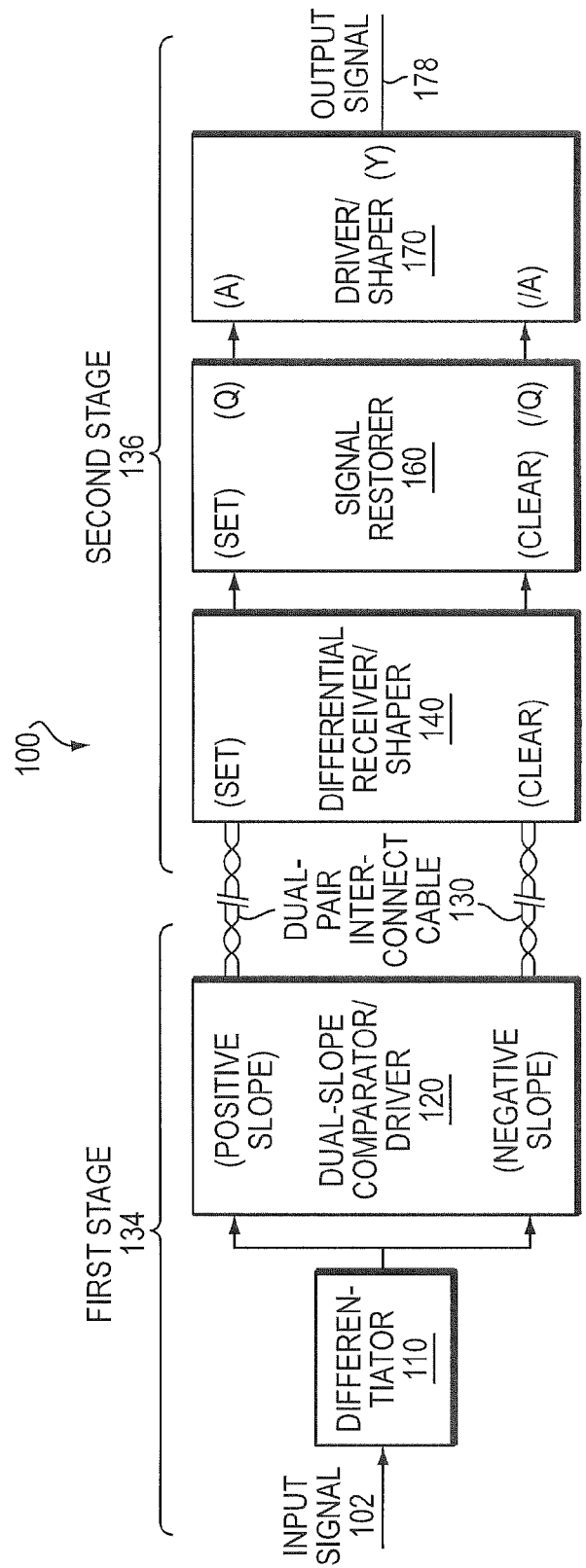
FIG. 1 is a block diagram of a multi-stage, passive capture adapter (PCA) circuit.

FIG. 1 is a block diagram of the multi-stage passive capture adapter (PCA) circuit 100. A high-speed input signal 102 is received at differentiator 110 of a first stage 134 of the PCA circuit 100. The high-speed input signal 102 may be a high-speed bus signal, such as a status or interrupt signal; however, in an embodiment described herein, the high-speed signal 102 is illustratively a data or strobe signal. The differentiator 110 illustratively functions as a high impedance probe having a port that contacts an original signal waveform of the high-speed digital input signal on the high-speed circuit, e.g., the serial bus (not shown). In an embodiment, the differentiator 110 is illustratively configured as a high-pass filter with a cut-off frequency substantially higher, e.g., many times higher, than a fundamental frequency of the input signal 102. To that end, the differentiator 110 includes a capacitor having a capacitance value of a few picofarads (pF) that, as described herein, does not materially load or otherwise interfere with the input signal 102.

Figure 2:
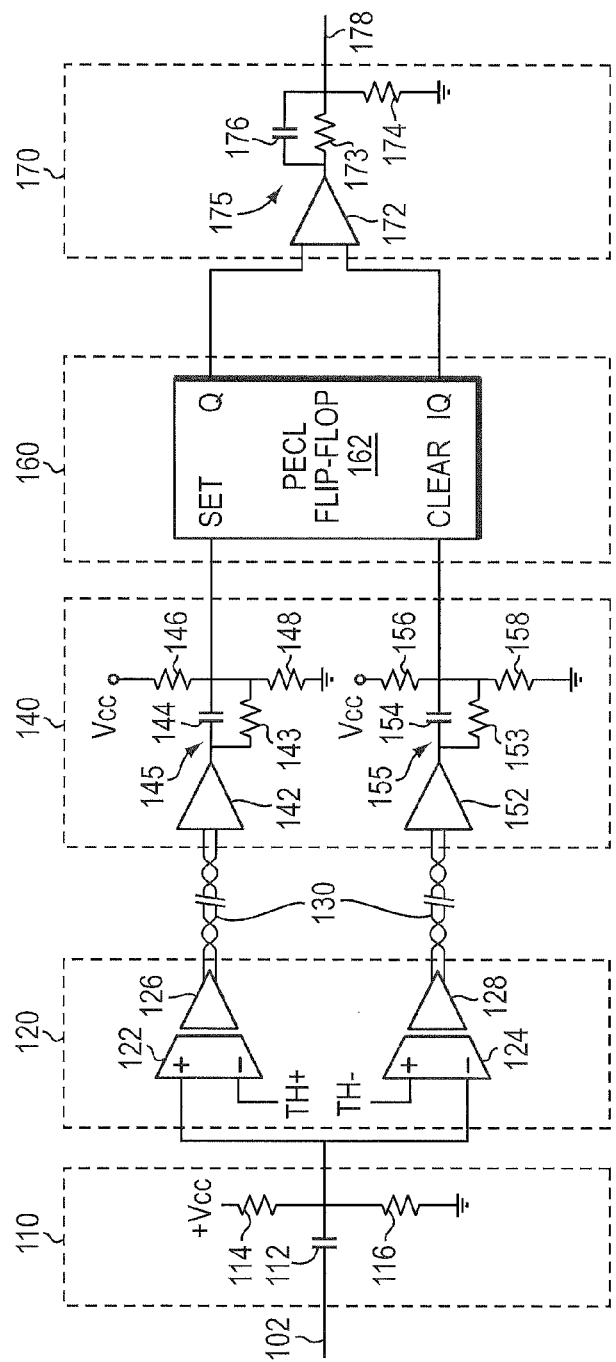
FIG. 2 is a circuit schematic diagram of the PCA circuit.

FIG. 2 is a circuit schematic diagram of the PCA circuit 100 that illustrates various electrical components of the circuit, including differentiator 110. In an embodiment, the input signal is initially captured at capacitor 112, which is illustratively substantially small, e.g., 2.2 pF. Upon passing through the capacitor 112, the input signal is fed to a pair of resistors 114, 116 arranged as a biasing network. Each resistor is illustratively 270 ohms such that, in terms of impedance, there is approximately 135 ohms effective impedance. The capacitor 112 is coupled to the plurality of resistors 114, 116 to form a substantially fast, high-pass time constant that is illustratively sub-nanosecond. As a result, when applied to the serial bus, the high impedance probe only slightly loads the bus and only at substantially high frequencies, i.e., there is no direct current (DC) load.

Figure 3:
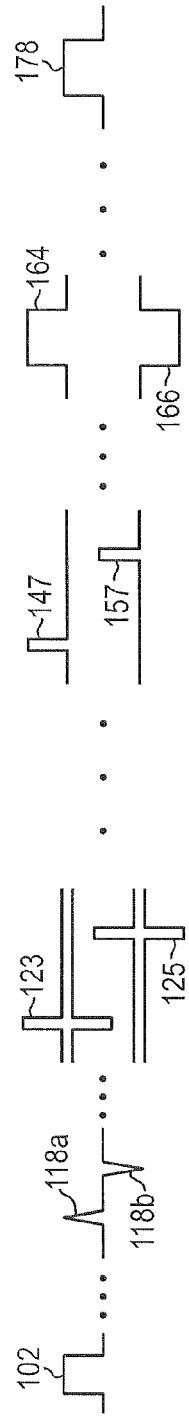
FIG. 3 is a signaling diagram of signals associated with the PCA circuit.

FIG. 3 is a signaling diagram of signals associated with the components of the PCA circuit, including differentiator 110. Since the time constant formed by the capacitor and resistor arrangement is substantially fast, only the edges (i.e., transitions) 118*a*,*b* of the original input signal waveform 102 pass through (traverse) the differentiator 110 and are sensed. In other words, the first stage 134 of the PCA circuit 100 only senses the edges of the signal waveform that transition between logic 0 and logic 1 levels, i.e., the differentiator 110 of the first stage 134 just senses the high frequency harmonic that is typical in a square-wave edge. Notably, the function of the differentiator 110 is different than that of a conventional high impedance probe which typically strives to sense the full bandwidth of the signal waveform Referring to FIGS. 1-3, upon traversing the differentiator 110, the signal waveform is fed to a dual-slope comparator/driver 120 of the first stage 134 that illustratively includes a plurality of high-speed comparators 122, 124 and drivers 126, 128. In an embodiment, the comparators are configured with threshold voltages such that the first comparator 122 responds to a positive-going slope or edge 118*a* (e.g., logic level 0 to 1) of the waveform and the second comparator 124 responds to a negative-going edge 118*b* (e.g., logic level 1 to 0) of the waveform. Specifically, the positive-going edge is connected to the non-inverting (+) side of the comparator 122 whereas a positive DC threshold voltage (TH+) is connected to the inverting side of the comparator. As would be known to those skilled in the art, the connections to the comparator 124 for the negative-going edge are reversed.

The threshold voltages are set such that each comparator responds only to its particular edge. For example, the positive-going edge 118*a* is compared with the positive threshold TH+ and, if exceeded, a transient positive-going pulse 123 is produced. In other words, when the positive-going edge rises above the threshold level, the non-inverted output of the comparator transitions "high" as the inverted output transitions "low" creating a differential signal/pulse 123 that is driven by driver 126. The negative-going edge 118*b* is likewise compared with a negative threshold TH− and if exceeded, a transient negative-going pulse 125 is produced by comparator 124 that is subsequently driven by driver 128. These pulses define the edges of the input signal and, thus, a duration of the original waveform 102, i.e., the outputs from the high-speed comparators 122, 124 represent the edges of the original input signal waveform.

In one or more embodiments described herein, the output of each comparator is illustratively a differential signal pair that is transmitted/driven (by driver 126, 128) over a dual-pair interconnect cable 130 to a second stage 136 of the PCA circuit 100 that is remote from the high-speed circuit to which the high impedance probe of the first stage 134 is connected. Illustratively, the outputs from the dual-slope comparator/driver 120 are arranged as low voltage differential (LVD) signal pairs that are driven over twisted pair transmission lines, each of which may be terminated with matching resistors. Note that there is illustratively a differential impedance of approximately 100 ohms for each pair of differential signals driven over the transmission lines of cable 130. Note also that LVD is a convenient signaling protocol because of its small voltage swings (e.g., in the 100 millivolt range) allowing for high-speed operation for the circuitry receiving the LVD signals. Thus, a function of the first stage 134 of the PCA circuit is to sense the edges 118*a*,*b* of the input (e.g., data and/or strobe) signals and transmit them over the dual-pair interconnect cable 130 for further processing by the second stage 136 of the PCA circuit 100.

Illustratively, the dual-pair interconnect cable 130 is a high-definition multimedia interface (HDMI) cable having sufficient length to ensure that the distance from the first stage 134 (i.e., interfacing to the high-speed circuit) to the second stage 136 of the PCA circuit 100 is such as to enable sufficient space for an operator (e.g., an engineer) to work. That is, only the first stage 134 of the PCA circuitry need be placed substantially close to the high-speed circuit (e.g., the high-speed serial bus). The length of the cable 130 may vary, e.g., from 8 or 10 inches to 3 or 4 feet, as long as it is not too long as to lose signal; illustratively, the length of the cable is approximately 20 inches (50 cm). In an embodiment described herein, the edges of the signals present on the serial bus illustratively occur at a frequency between, e.g., 250 to 500 MHz and, more specifically, about 480 MHz. Once differentiated and driven over the cable by the dual-slope comparator/driver 120, the differential signals (i.e., plus and minus edges) are rendered as square as possible with a frequency of approximately the same as the frequency of the serial bus signals (e.g., about 250 to 500 MHz).

According to one or more embodiments, the second stage 136 includes a differential receiver/shaper 140 having a plurality of differential receivers 142, 152 connected to first and second shaper networks 145, 155, each of which is formed of a resistor 143, 153 and a capacitor 144, 154 arranged in parallel and coupled to a totem pole of resistors 146/148, 156/158. The differential receiver/shaper 140 functions to convert the LVD signal pairs, e.g., received at its SET and CLEAR inputs, to single-ended signals 147, 157 that are applied as inputs to a signal restorer 160. Illustratively, the differential receivers 142, 152 are paired and receive the differential signal pairs transmitted over the cable 130 from the dual-slope comparator/driver 120. It should be noted that the use of differential signaling/paths by the high-speed line drivers and receivers is preferred because such paths are more noise resistant and block interference. Interference tends to affect both signal paths of a pair equally and therefore at the receivers the signals are subtracted, and interference cancels out. The resulting outputs of the differential receivers are thus fairly sharp-edged pulses/signals.

Specifically, the resulting outputs of the differential receivers are fed to the shaper networks 145, 155, which illustratively convert the logic levels of the differential receiver outputs to input signals 147, 157 that set and reset (clear) the signal restorer 160 of the second stage 136. In an embodiment, each capacitor 144, 154 of the shaper network 145, 155 is illustratively 1 pF while its parallel resister 143, 153 is illustratively 33 ohms. The resistors 146, 156 in the totem pole are illustratively 180 ohms while the resistors 148, 158 are illustratively 150 ohms. More specifically, the shaper networks illustratively convert the logic levels for proper operation with semiconductor technologies of the differential receivers and the signal restorer.

Illustratively, the signal restorer 160 is embodied as a "positive emitter coupled logic" (PECL) edge reconstruction flip-flop 162 configured to respond to the single-ended input signals 147, 157 to reconstruct the edges of the original input signal waveform. PECL semiconductor technology is illustratively used in the PCA circuit 100 because of the need for a substantially fast flip-flop 162. The shaper networks 145, 155 convert the logic levels (e.g., 1 and 0) from the outputs of the differential receivers 142, 152 to levels suitable for the SET and CLEAR inputs of the PECL flip-flop 162. That is, the shaper networks basically level shift signals to appropriate PECL logic levels to produce very sharp edges in the Q, /Q outputs (i.e., output signals 164, 166) of the flip-flop 162. Subsequently, the output signals 164, 166 of the PECL flip-flop 162 are re-shifted to relative levels, as described further herein. Note that an aspect of the PCA circuit 100 is to provide an edge reconstruction flip-flop 162 that is as fast as possible. Illustratively, the PECL flip-flop 162 is preferably at least a factor of 4 or 5 faster than the input signals to thereby accommodate, e.g., setup and hold times of picoseconds.

Note also that PECL is a differential output technology that operates best when terminated properly. Accordingly, a plurality of resistors, e.g., 137 and 82 ohm resistors (not shown), are illustratively used to terminate the outputs of the flip-flop 162.

In an embodiment, the output signals delivered by the signal restorer 160 are fed as input signals to driver/shaper 170, which combines the input signals to produce a digital signal substantially similar to the input signal waveform. Specifically, a driver 172, e.g., a PECL component, of the driver/shaper 170 receives the input signals 164, 166 at inputs A, /A and combines them to an output that is fed to a third shaper network 175. The third shaper network 175 illustratively includes a plurality of resistors 173, 174 (e.g., 100 ohms each) and a capacitor 176 (e.g., 15 pF) arranged and configured to substantially match an output signal 178 of driver/shaper 170 to the input digital signal 102 sensed from the high-speed circuit (e.g., the high-speed serial bus). In other words, the third shaper network 175 essentially adjusts the loading parameters and transmission characteristics of the second stage 136 to match and reconstruct such parameters and characteristics of the probed serial bus. Accordingly, the differential signals transmitted over the cable 130 are level-shifted and shaped at the second stage 136 of the PCA circuit 100 to produce a single-ended signal reconstruction of the original input signal waveform.

Advantageously, the PCA circuit provides a high-impedance, front-end interface circuit that essentially produces digital signal levels equivalent to those present on the high-speed circuit. To that end, the PCA circuit provides a substantially high impedance interface at DC and low frequencies through, e.g., alternating current (AC) coupling of a digital input signal to a very small capacitor of the differentiator, which blocks the DC and low frequencies. The PCA circuit thus does not load the high-speed circuit at either at zero frequency (DC) or low frequency (e.g., up to 100 MHz). This is particularly appropriate for high-speed circuits embodied as buses that employ weak resistive pull-up mechanisms to establish default rest states; such buses may be disturbed if conventional signal probes are used. An example of such a bus is a high-speed inter-chip (HSIC) Universal Serial Bus (USB) that is commonly used chip-to-chip within handheld devices where battery life is essential. For such a use, there is a motivation against wasting energy, e.g., by dissipating electrical energy in a resistor whose only purpose is to establish a default state of a signal line. Prior approaches attempted to use "state setting" resistors with resistances that are as high as possible, e.g., hundreds of thousands of ohms or even a mega ohm. However, a conventional scope probe used to analyze the signal line typically has a DC resistive component in its input impedance that significantly reduces the input signal and may cause improper operation at a receiver during an idle state, by pulling the voltage away from the proper idle voltage.

In an embodiment described herein, the PCA circuit is particularly suitable for capturing traffic (e.g., high-speed input signal waveforms, such as data and/or probe) from a HSIC USB. For example, data may be transmitted over the bus at low-voltage logic levels using single-ended signaling. During data transmission, the output impedance of the circuit is low, typically 30 to 50 ohms, matching the dynamic impedance of the transmission lines of the bus. During idle periods, however, the lines of the HSIC USB are terminated to substantially high-impedance sources (typically 100K). Despite the high impedance, the lines must maintain their previous DC level. This makes it very hard to use a conventional oscilloscope probe without disturbing the signal. Because it presents essentially no DC load, the PCA circuit does not disturb the HSIC USB during the idle period. The use of series capacitors further causes the PCA circuit to present substantially low capacitive load. It should be noted that the PCA circuit is particularly useful for situations where minimum and maximum data rates are known, and where the edges are expected to be clean (without significant ringing). This is notably true for HSIC USB.

The differentiator of the PCA circuit also provides reasonable impedance at high frequencies, thereby presenting a negligible AC load on the high-speed circuit. Typically, the signal energy for a sensing circuit is acquired from the high-speed circuit and, thus, it is desirable to use as little of that signal energy as possible. The PCA circuit described herein accomplishes this by employing a differentiating input capacitor that is as small as possible such that the amount of energy acquired from the high-speed circuit is as small as possible. Note that as the available sensed (input) signal decreases, the circuit becomes vulnerable to noise and other distractions. The size of the input capacitor enables acquisition of as little signal energy as possible from the high-speed circuit, while still enabling the PCA circuit to operate reliably.

In addition, the edge detection and subsequent signal restoration circuitry of the PCA circuit allow the input signals to vary considerably in amplitude and wave shape, without materially affecting the relative timing of the signals. For example, in the case of the high-speed serial bus, maintaining the relative timing of the input signal (e.g., data or strobe) is important, and more conventional sensing methods have a greater risk of changing or destroying the timing relationship. As a result, the signal shaper of the PCA circuit is not merely resistive, but also includes a capacitor to compensate for the loss of high frequencies that naturally happens upon a circuit board. As described herein, the PCA circuit is configured to analyze the edges of input digital signals; accordingly, it generally does not matter what happens to those signals between the edges. This is notable because, e.g., the 0 and 1 logic levels between the edges of signals on a bus are not very good; the signals drift or may have noise on them. This is also notable because in HSIC USB applications, the edges are always driven at a low impedance, but the 0 and 1 logic levels may be only weakly driven. Capacitive coupling and then sensing edges, as with the PCA circuit, adds load only to the edges (which are driven at low impedance), and does not disturb the bus with significant leakage currents during the high impedance state. Another aspect of the PCA circuit is that the differentiation occurs immediately at its first stage (i.e., at the differentiator) when the signals are least distorted/degraded through operation on only the edges of the signals.

Moreover, the use of LVD signaling between the first stage and the second stage of the PCA circuit permits a high degree of convenience for an operator (e.g., an engineer) using the circuit during, e.g., testing such that external test equipment may be placed at some distance from the signal being probed. That is, the use of the dual-pair interconnect (e.g., HDMI) cable and its associated LVD signaling protocol allow the engineer to place the first stage (e.g., embodied as a small circuit board) of the PCA circuit next to the high-speed circuit, without being burdened with a substantially larger apparatus.

While there has been shown and described illustrative embodiments of a multi-stage PCA circuit configured to sense and recover high-speed digital signals present on a high-speed circuit for capture and analysis in external test equipment, it is to be understood that various other adaptations and modifications may be made within the spirit and scope of the embodiments herein. As described herein, the PCA circuit functions as a high-impendence, front-end circuit that produces digital signal levels equivalent to those present on the high-speed circuit which, illustratively, is a high-speed serial bus. However, the PCA circuit could be configured to match the required impedance of other circuits (i.e., "circuits-under-test") to which it may interface. For example, if a circuit-under-test were configured to a different set of electrical protocols and/or different logic levels, then various stages of the PCA circuit would be configured accordingly to match the desired protocols and levels. It should be note that the values of the PCA circuit components described herein are relative to the signaling technology of the circuit's various stages. Thus, if a technology different than, e.g., PECL was utilized for certain components, then the values of the various resistors and capacitors interfacing to the PECL components would be different for the different technology. Notably, the PCA circuit may be configured to use its differentiating and reconstruction circuitry as a front end for a variety of different technologies and different circuits-under-test, such as buses, with different electrical characteristics.

The foregoing description has been directed to specific embodiments and, thus, the description is to be taken only by way of example and not to otherwise limit the scope of those embodiments. Therefore, it is an object of the appended claims to cover all variations and modifications as come within the true spirit and scope of the embodiments herein.

What is claimed is:

1. A circuit comprising:
 a differentiator configured as a high impedance probe to capture an input signal waveform from a high-speed circuit, the differentiator having a high-pass filter configured to sense edges of the input signal waveform, wherein the high-pass filter has a cut-off frequency higher than a fundamental frequency of the input signal waveform, wherein the input signal waveform is a digital signal formatted according to a Universal Serial Bus (USB) Protocol, wherein the high-speed circuit is a channel of a high-speed inter-chip (HSIC) USB, wherein the circuit provides approximately no load to the HSIC channel below 100 MHz; and
 a dual-slope comparator/driver coupled to the differentiator and configured to respond to the edges of the input signal waveform, the dual-slope comparator/driver configured to respond to the edges to drive dual differential signal pairs.

2. The circuit of claim 1 wherein the fundamental frequency of the signal waveform is greater than 200 MHz.

3. The circuit of claim 1 wherein the dual-slope comparator/driver comprises:
 a plurality of high-speed comparators, wherein a first comparator is configured with a first threshold voltage that enables the first comparator to respond to a positive-going edge of the input signal waveform and a second comparator is configured with a second threshold voltage that enables the second comparator to respond to a negative-going edge of the input signal waveform.

4. The circuit of claim 3 wherein the first comparator outputs a first pulse in response to the positive-going edge of the input signal waveform, and wherein the second comparator outputs a second pulse in response to the negative-going edge of the input signal waveform.

5. The circuit of claim 4 wherein the output of the first comparator is a first differential signal pair, and wherein the output of the second comparator is a second differential signal pair.

6. The circuit of claim 1 further comprising:
a first end of a dual-paired interconnect cable connected to the dual-slope comparator/driver; and
a second end of the dual-pair interconnect cable connected to a signal restorer, a differential receiver/shaper configured to convert the differential signal pairs to single-ended signals that are received by the signal restorer, the signal restorer configured to respond to the single-ended signals to reconstruct the edges of the input signal waveform and deliver output signals that are fed as input signals to a driver/shaper, the driver/shaper configured to combine the input signals to produce a digital signal substantially similar to the input signal waveform.

7. The circuit of claim 6 wherein the dual-pair interconnect cable remotely interconnects the differential receiver/shaper from the high impedance probe.

8. The circuit of claim 6 wherein the dual-pair interconnect cable is at least 8 inches long.

9. The circuit of claim 6 wherein the differential receiver/shaper comprises:
a plurality of differential receivers connected to first and second shaper networks.

10. The circuit of claim 9 wherein each of the first and second shaper networks is formed of a second resistor and a second capacitor arranged in parallel and coupled to a totem pole of resistors.

11. The circuit of claim 6 wherein the signal restorer comprises:
an edge reconstruction flip-flop, wherein the flip-flop is more than three times faster than the fundamental frequency of the input signal waveform.

12. The circuit of claim 6 wherein the driver/shaper comprises:
a driver configured to receive and combine the input signals; and
a third shaper network coupled to an output of the driver.

13. The circuit of claim 12 wherein the third shaper network comprises:
a third plurality of resistors and a third capacitor arranged and configured to substantially match the digital signal produced by the driver/shaper to the input signal waveform.

14. A method of transmitting a digital signal comprising:
performing a high-pass filter on the digital signal, wherein the high-pass filter has a cut-off frequency substantially higher than a fundamental frequency of the digital signal;
generating a first stream of pulses corresponding to positive going edges of the high-pass filtered digital signal;
generating a second stream of pulses corresponding to negative going edges of the high-pass filtered digital signal; and
transmitting the first stream of pulses and the second stream of pulses over separate differential pairs of cables.

15. The method of claim 14 further comprising:
receiving the first and second stream of pulses over their respective separate pair of cables;
setting a flip-flop using the first stream of pulses;
clearing the flip-flop using the second stream of pulses; and
reshaping an output of the flip-flop, thereby to substantially reconstruct the digital signal.

16. The method of claim 14 wherein the digital signal is a channel of a High Speed Inter-Chip (HSIC) Universal Serial Bus.

17. The method of claim 15 wherein reshaping the digital signal further comprises:
level-shifting the output of the flip-flop.

18. A method of reconstructing a digital signal comprising:
performing a high-pass filter on the digital signal, wherein the high-pass filter has a cut-off frequency substantially higher than a fundamental frequency of the digital signal;
generating a first stream of square wave pulses corresponding to positive going edges of the high-pass filtered digital signal;
generating a second stream of square wave pulses corresponding to negative going edges of the high-pass filtered digital signal;
setting a flip-flop using the first stream of square wave pulses;
clearing the flip-flop using the second stream of square wave pulses, wherein the flip-flop is at least four times faster than the fundamental frequency of the digital signal; and
reshaping an output of the flip-flop to substantially reconstruct the digital signal.

19. The circuit of claim 1 wherein the HSIC channel remains undisturbed during a USB idle period.

* * * * *